United States Patent
Grundy (12)

(10) Patent No.: US 6,340,913 B1
(45) Date of Patent: Jan. 22, 2002

(54) FILTER CIRCUIT WITH POSITIVE FEEDBACK LOOP

(75) Inventor: David L. Grundy, Oldham (GB)

(73) Assignee: Fast Analog Solutions Limited (GB)

( * ) Notice: Subject to any disclaimer, the term of this patent is extended or adjusted under 35 U.S.C. 154(b) by 0 days.

(21) Appl. No.: 09/640,905

(22) Filed: Aug. 16, 2000

(30) Foreign Application Priority Data

Aug. 19, 1999 (GB) ............................................. 9919550

(51) Int. Cl.⁷ ................................................. H03K 5/01
(52) U.S. Cl. ........................ 327/552; 327/558; 327/559
(58) Field of Search ................................. 327/552, 553, 327/554, 555, 556, 557, 558, 559; 330/305, 107, 105

(56) References Cited

U.S. PATENT DOCUMENTS 4,306,198 A * 12/1981 Okada .......................... 330/260
4,965,833 A * 10/1990 McGregor et al. ............ 381/83

FOREIGN PATENT DOCUMENTS

| EP | 0 049 997 | 4/1992 |
|---|---|---|
| GB | 1119708 | 7/1968 |
| GB | 1240335 | 7/1971 |
| GB | 1603038 | 11/1981 |
| GB | 2194402 A | 3/1988 |
| GB | 2224406 A | 5/1990 |

\* cited by examiner

*Primary Examiner*—Dinh T. Le
(74) *Attorney, Agent, or Firm*—Skjerven Morrill MacPherson LLP; Norman R. Klivans

(57) ABSTRACT

A filter circuit comprising a phase advance circuit acting as a high pass filter, a phase retard circuit acting as a low pass filter, and an amplifier connected in series between an input and an output. A positive feedback loop is provided between the input and the output. The electrical characteristics of the phase advance and phase retard circuits are such that interaction between the phase advance and phase retard circuits is substantially prevented. This may be achieved by providing the phase advance and phase retard circuits with simple output buffers or providing internal closed loop negative feedback paths to provide low output impedances. The phase advance and phase retard circuits may comprise multipliers configured to compensate for variations in the values of resistive and capacitive components of the filter circuits.

12 Claims, 13 Drawing Sheets

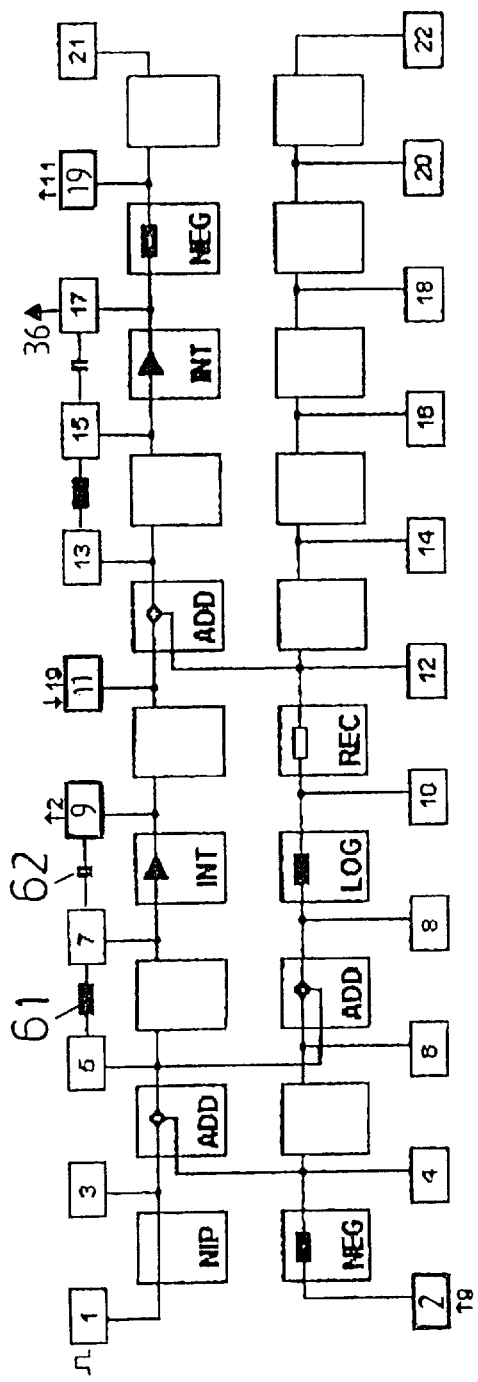
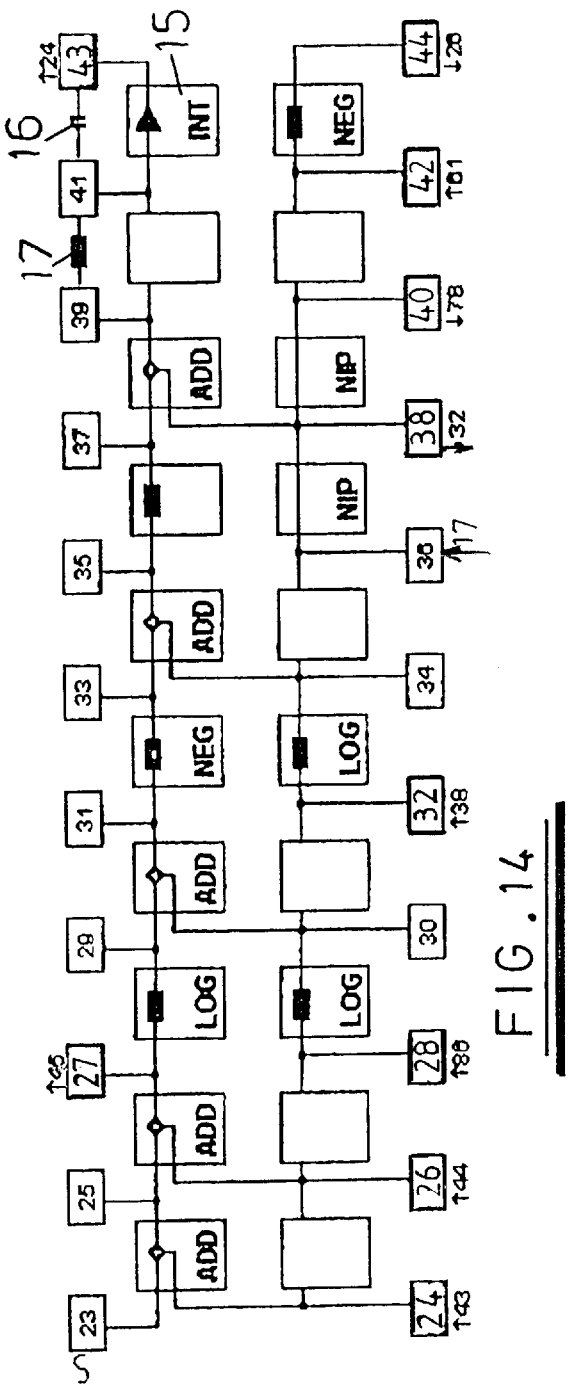
FIG. 13
FIG. 14

FILTER CIRCUIT WITH POSITIVE FEEDBACK LOOP

FIELD OF THE INVENTION

The present invention relates to a filter circuit comprising a phase advance circuit acting as a high pass filter and a phase retard circuit acting as a low pass filter.

BACKGROUND

Many electric circuits which act as oscillators or filters are known. One such oscillator is the Wien bridge which uses phase advance/retard principles. The Wien bridge oscillator comprises a feedback amplifier with 180° phase shift at a desired output frequency, the loop gain of the amplifier being adjusted so that a self sustaining oscillation just takes place. The feedback is arranged so that the amplitude of the oscillation remains within the linear region of the amplifier.

The Wien bridge oscillator suffers from the disadvantage that it has an attenuation factor of 3. Where the Wien bridge is used as a filter, this increased attenuation means that higher Q filters suffer from a lack of stability.

A further disadvantage of known circuits using phase advance/retard principles is that they commonly require phase shifts of 90° which can be difficult to guarantee, particularly over a wide range of frequencies.

Filters generally incorporate resistor/capacitor circuits comprising at least one resistor and at least one capacitor connected such that a time constant of the filter is a function of the electrical characteristics of the resistor/capacitor circuit. Generally resistor/capacitor circuits are implemented using discreet components as it has proved difficult to provide on-chip resistor/capacitor circuits with the characteristics and stability required for filter circuits. Even with discreet components it is still necessary in many applications to provide stabilising circuits to compensate for example for variations in resistance and capacitance resulting from fluctuations in temperature. As a result conventional filters tend to be relatively complex, bulky and expensive.

It is known that resistance and capacitance components can be provided on-chip, but although it is possible to produce such components in batches in which the component values are consistent as between all members of the same batch, it is difficult to produce components with electrical characteristic values which are close to a predetermined desired value. Furthermore, it is not possible easily to produce on-chip components with high values of resistance and capacitance in a reliable manner, and it is not possible to stabilise the electrical values of such components without extensive additional circuitry. As a result it has not proved possible to provide filters with on-chip resistor/capacitor circuits which determine timing constants of the filter in an economic manner.

It is an object of the present invention to obviate or mitigate some or all of the problems outlined above.

SUMMARY

According to the present invention, there is provided a circuit comprising a phase advance circuit acting as a high pass filter, a phase retard circuit acting as a low pass filter, and an amplifier connected in series between an input and an output, a positive feedback loop being provided between the input and the output, wherein the electrical characteristics of the phase advance and phase retard circuits are such that interaction between the phase advance and phase retard circuits is substantially prevented.

Interaction between the phase advance and phase retard circuits can be achieved for example by incorporating simple output buffers in those circuits. The phase advance and phase retard circuits themselves may be extremely simple, for example the phase advance circuit may comprise a series capacitor and a shunt resistor whereas the phase retard circuit may comprise a series resistor and a shunt capacitor.

Preferably, interaction between the phase advance and phase retard circuits is avoided by providing each of those circuits with internal feedback paths which provide low output impedances. In such an arrangement the phase advance and phase retard circuits may incorporate integrator circuits. The internal feedback paths may be achieved by incorporating closed loop negative feedback configurations.

The amplifier may be in the form of a multiplier responsive to a Q setting input. The phase advance and phase retard circuits may comprise resistive and capacitive components and multipliers configured to compensate for variations in the values of those resistive and capacitive components. A calibration circuit may be provided which also incorporates resistive and capacitive components and provides a calibration output to the multipliers of the phase advance and phase retard circuits, the calibration circuit being configured such that the calibration output is responsive to variations in the values of the resistive and capacitive components of the calibration circuit.

Preferably the resistive and capacitive components of the phase advance circuit, the phase retard circuit, and the calibration circuit are substantially identical. The resistive and capacitive components of the phase advance circuit, the phase retard circuit and the calibration circuit may be fabricated on respective chips. The calibration circuit may comprise an oscillator, a differentiator, a rectifier and a low pass filter, the differentiator incorporating the resistive and capacitive components of the calibration circuit. The multipliers of the phase advance and phase retard circuits may also be connected to receive a filter frequency setting input in addition to the calibration output of the calibration circuit.

Embodiments of the present invention will now be described, by way of example, with reference to the accompanying drawings, in which:

BRIEF DESCRIPTION OF THE DRAWINGS

FIGS. 12 and 13 illustrate a programmable chip capable of functioning as the calibration circuit of FIG. 11; and FIGS. 14, 15 and 16 illustrate programmable circuits which together can be used in the circuit of FIG. 9.

FIG. 1 illustrates a circuit which may act as a band pass filter or as an oscillator. The circuit has an input 1 and an output 2. Positive feedback is applied via connection 3 to an adder 4. Phase advance circuit 5 acting as a high pass filter, a phase retard circuit 6 acting as a low pass filter, and an amplifier 7 are connected in series between the input 1 and the output 2. The amplifier 7 is provided with a series resistor 8 and a shunt resistor 9.

DETAILED DESCRIPTION

In accordance with the invention, the high pass filter 5 and low pass filter 6 are connected in a manner such that there is no interaction between them. As interaction between the high and low pass filters is prevented, the operational characteristics of the circuit are relatively simple. Interaction may be prevented in a variety of ways, for example by the use of simple buffers as illustrated in FIG. 2.

Figure 2:
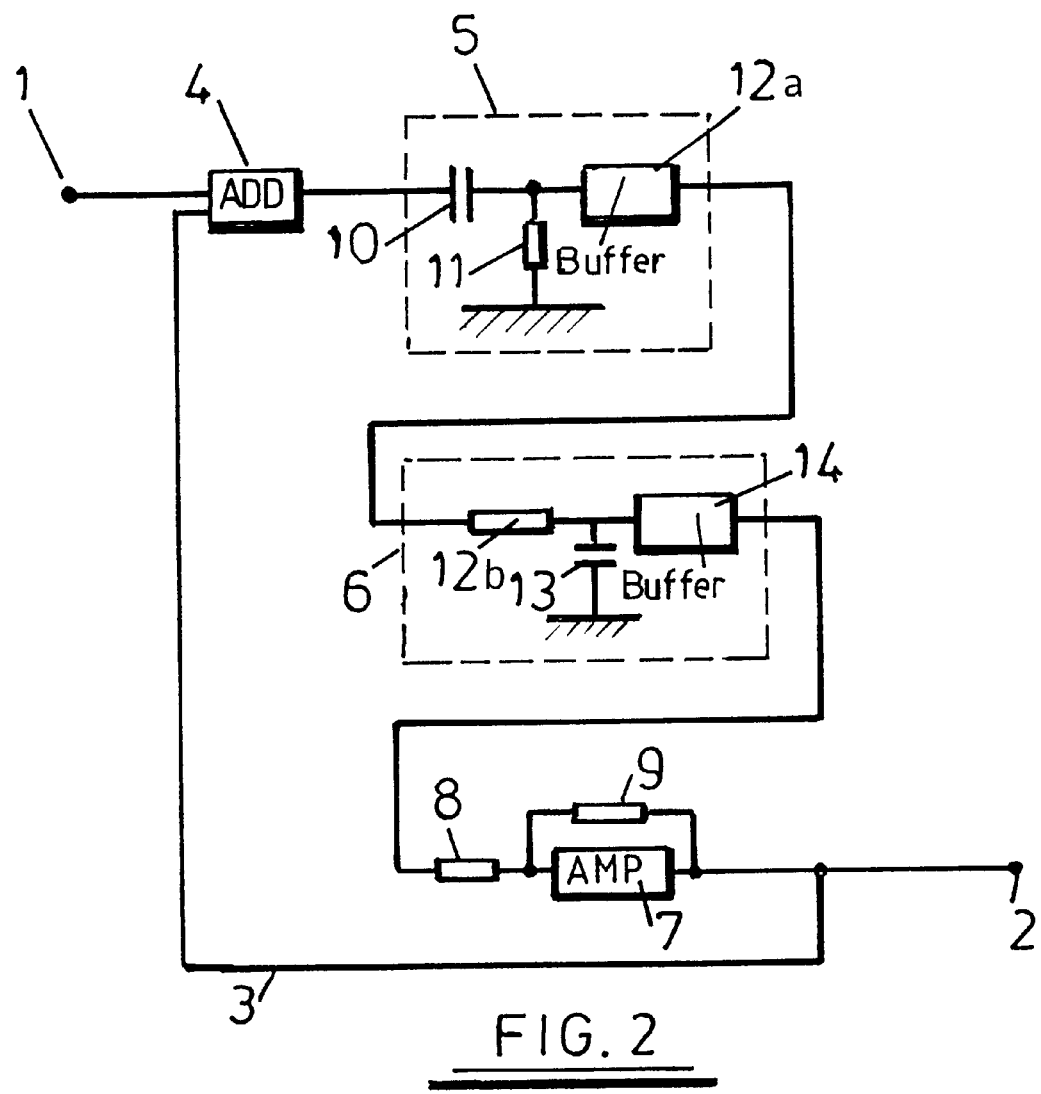
FIG. 2 illustrates a circuit in accordance with the present invention with the same general structure as the circuit of FIG. 1.

Referring to FIG. 2, the high pass filter 5 is in this example implemented as a series capacitor 10 and shunt resistor 11. A buffer circuit 12a prevents any interaction between the high pass filter and the rest of the circuit. The low pass filter 6 comprises a series resistor 12b and a shunt capacitor 13 the output of which is isolated by a buffer 14. Thus a circuit in accordance with the invention can be produced from very simple conventional components in the form illustrated in FIG. 2. It will be appreciated that the order in which the three basic components (high pass filter, low pass filter and amplifier) are connected can be adjusted as convenient. For example the positions of the two filters can be reversed and the amplifier can be positioned either before, between or after the two filter circuits.

Figure 3:
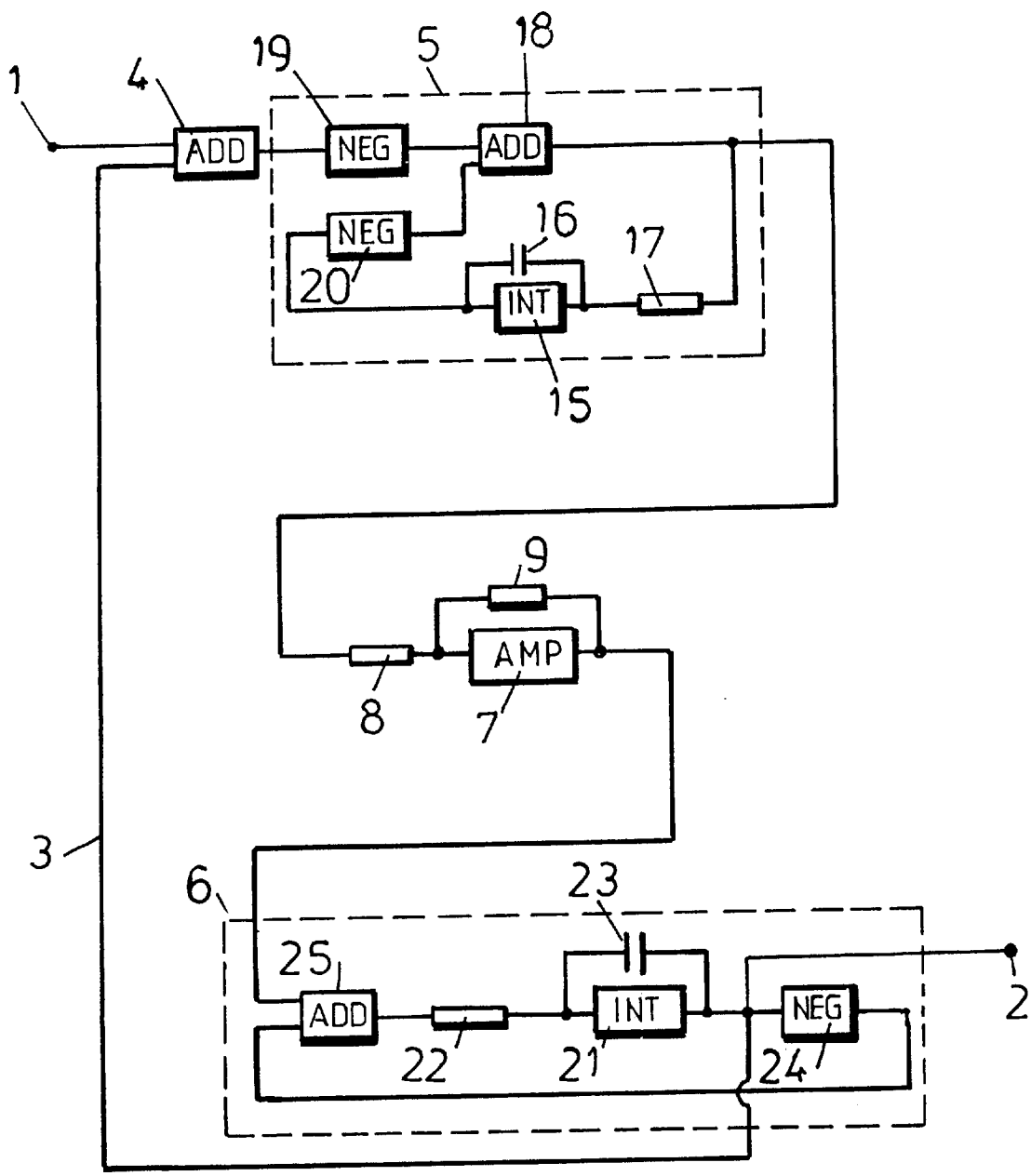
FIG. 3 illustrates a further embodiment of the present invention in which the filter circuits have a closed loop negative feedback configuration.

FIG. 3 illustrates a further embodiment of the present invention in which rather than using simple buffer circuits as in FIG. 2 to mutually isolate the filter components a closed loop negative feedback configuration is utilised to achieve the necessary isolation. In the arrangement of FIG. 3, the amplifier 7 is connected between the high pass filter 5 and low pass filter 6 rather than after the two filter circuits as in the embodiment of FIG. 2. The high pass filter 5 and low pass filter 6 are formed from components made available in field programmable analogue devices of the type described in international patent application number PCT/GB97/02336 (publication number WO 98/10362). Such circuits can be obtained from Fast Analog Solutions Limited of Fields New Road, Chadderton, Oldham, OL9 8NP, United Kingdom. Specifically the circuit comprise INT circuits (one of the options of the AUX function described in the above published specification), NEG which is a simple negate circuit, and ADD which simply sums the two signals input to it. The circuits which performs these and other functions of such field programmable devices are illustrated in greater detail in FIG. 4 which corresponds to FIG. 5 of the above-mentioned published international patent application.

Referring to FIG. 3, the high pass filter 5 comprises an INT circuit 15 connected in parallel with a capacitor 16 and in series with a resistor 17. Together these three components define an integrator, which provides a true mathematical integration of signals at the output of the ADD circuit 18, that is the phase delay provided by the integrator is 90°. The gain of the integrator is 0 dB when the impedance of the capacitor 16 is equal to the resistance 17. In these conditions the frequency F will be:

$$F = \frac{1}{2}\pi CR$$

where C is the capacitance of the capacitor 16 and R is the resistance of the resistor 17.

The phase shift provided by the integrator deviates gradually from −90° as the frequency moves away from that frequency which provides a gain of 0 dB. This is a result of the limited open loop gain of an amplifier included in the INT circuit 15 (which is illustrated in greater detail in FIG. 4). Negate circuits 19 and 20 are provided as the cells of the field programmable circuit (e.g. INT and ADD) invert the signals applied to them. The output of the negate circuit 20 is applied to the adder 18. This closed loop negative feedback configuration which is internal to the high pass filter 5 provides the high pass filter 5 with a low output impedance and hence prevents interaction between the high pass filter 5 and the low pass filter 6.

The output from the high pass filter 5 is connected via resistor 8 to the amplifier 7. The amplifier 7 is provided with negative feed back via resistor 9. The output from the amplifier 7 is connected to the low pass filter 6.

The low pass filter 6 includes an integrator comprising an INT circuit 21 connected in series with a resistor 22 and in parallel with a capacitor 23. The integrator functions as described above in relation to the high pass filter 5. The output from the integrator is connected via a negate circuit 24 and an ADD circuit 25 (receiving on another input the output of the amplifier 7) to the resistor 22. The output 2 of the low pass filter is taken from the INT circuit 21. That output from the low pass filter 6 is also connected via ADD circuit 4 to the high pass filter 5. The closed loop negative feedback configuration internal to the low pass filter 6 provides the filter 6 with a low output impedance and hence prevents interaction between the filter 6 and the filter 5.

The absence of any interaction between the filters 5 and 6 greatly simplifies the formulae which describe the performance of the filter circuits and are needed to calculate the operating frequency of the overall circuit. In addition, the two integrators incorporated in the high pass and low pass filters have substantially the same properties and as a result the phase shifts they produce are equal and opposite. As a result the phase shifts do not have to be fixed across a range of frequencies which is a significant advantage for embodiments of the invention comprising such matched integrators.

The operation of the circuit illustrated in FIG. 3 is described by the following equations:

High pass filter 5 (phase advance) $= -j\text{wCR}/(1 + j\text{wCR})$

Low pass filter 6 (phase retard) $= 1/(1 + j\text{wCR})$

Amplifier gain $= -Ao$

Loop gain $= (Ao j\text{wCR}/(1 + j\text{wCR}))/(1 + j\text{wCR})$
$= Ao j\text{wCR}/(1 - (wCR)^2 + j\text{w2CR})$
$= Ao j\text{wCR}((1 - wCR)^2 - j\text{w2CR})/$
$((1 - (wCR)^2) + (w2CR)^2)$ At the centre frequency there is zero phase shift and hence j terms are zero:

or$(1-(wCR)^2)=0$ $wCR=1$ or the centre frequency $fo=\frac{1}{2}\pi CR$

Inserting this condition gives a centre frequency gain Acf of Ao/2

When the loop gain of the circuit shown in FIG. 3 is less than 1, then the circuit will act as a band pass filter. When the loop gain of the circuit shown in FIG. 3 is greater than 1, then the circuit will act as an oscillator. The band pass filter has a Q which may be increased by increasing the feedback to provide a high Q filter.

Figure 5:
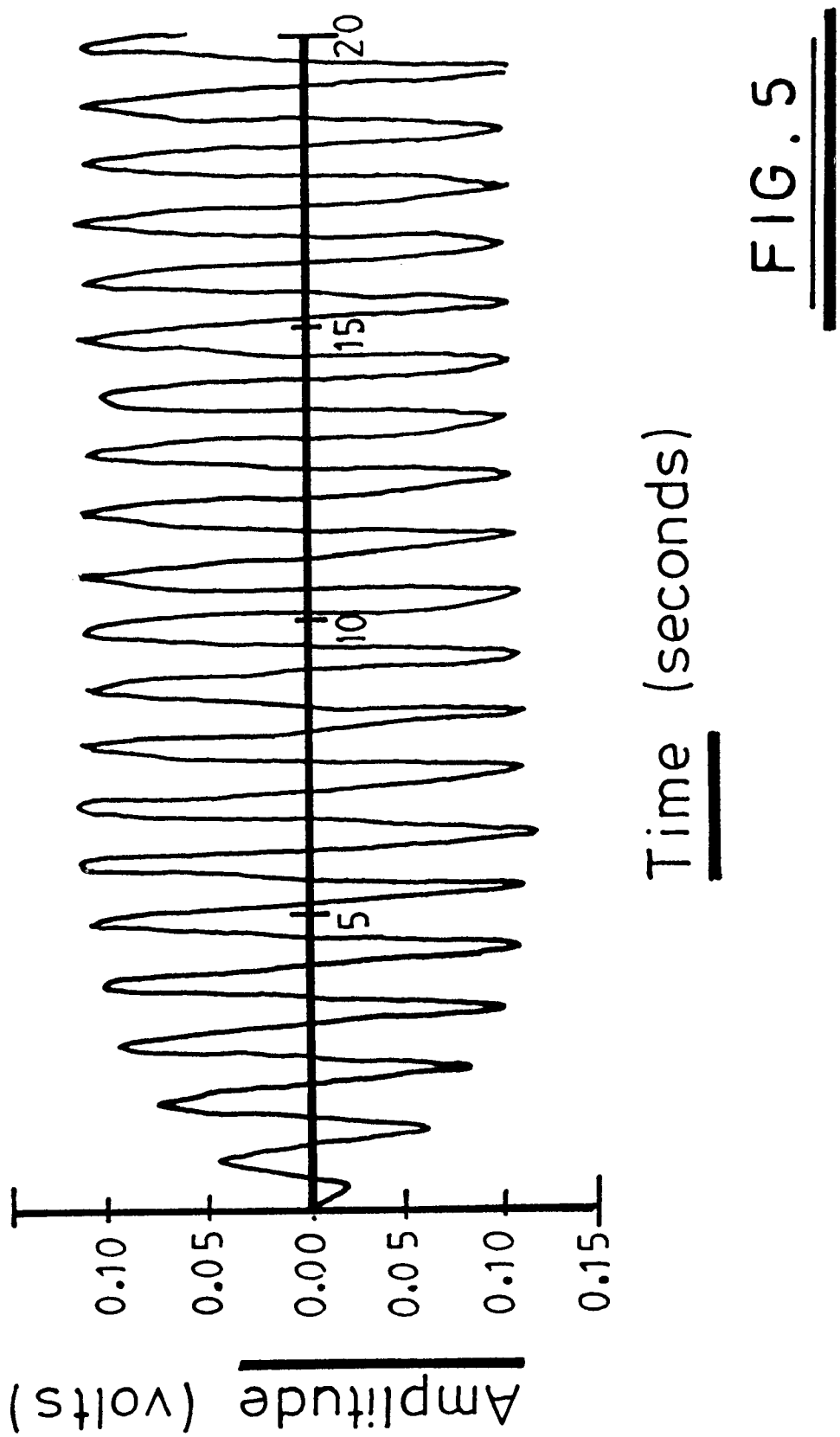
FIG. 5 illustrates a simulation for the circuit of FIG. 3.

The above equations demonstrate that the centre frequency of the circuit is given by $f_o=\frac{1}{2}\pi CR$, and the corresponding loop gain is $A_o/2$, where $A_o$ is the gain of the amplifier 7. FIG. 5 shows a simulation for the circuit with $A_o$ set to 1.8 and an input level of 0.01. It can be seen from FIG. 5 that for an input level of 0.01 the output is 0.1. The filter is thus providing a gain of approximately 10 times. The gain is given by $A=0.5\ A_o/(1-0.5\ A_o)$.

An important advantage of the described filter is that the phase shift provided by the high pass filter 5 and the low pass filter 6 only need to be equal and opposite (in this case 45□), but are not required to be 90°. This is advantageous because it is difficult to provide phase shifts of 90° over wide ranges of frequencies.

Figure 6:
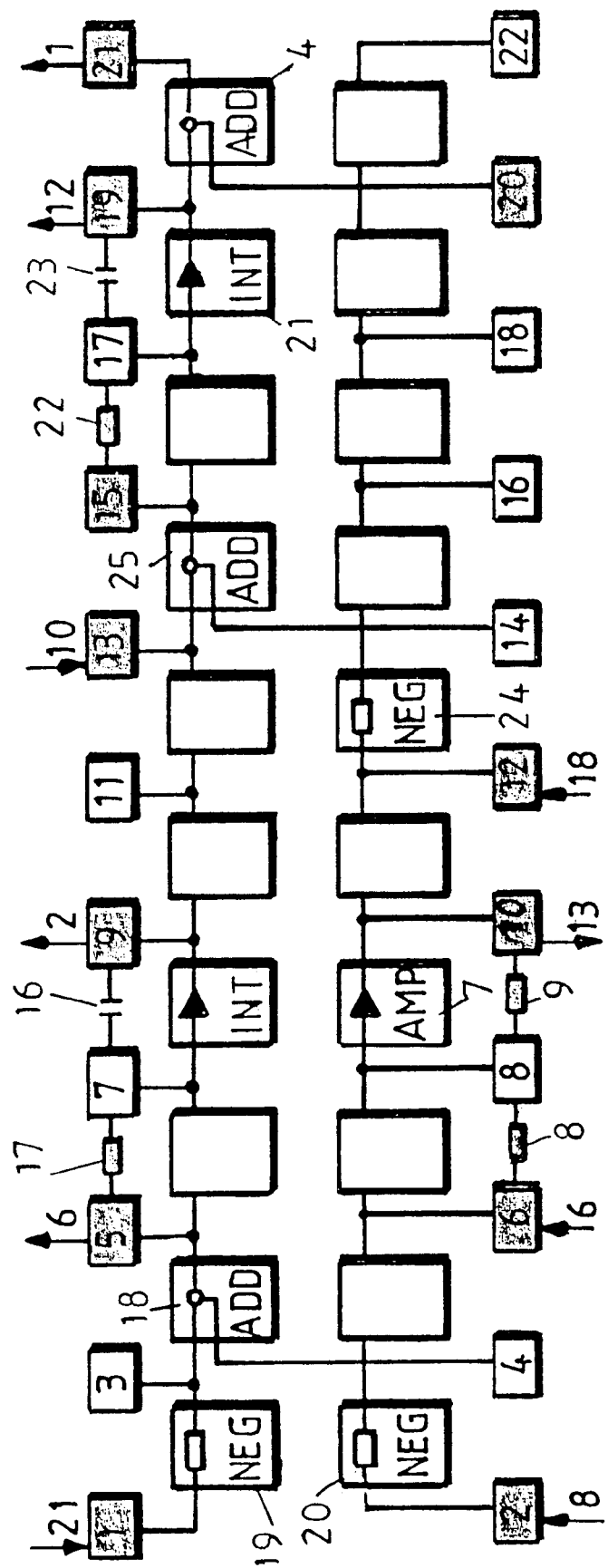
FIG. 6 illustrates an implementation of the circuit of FIG. 3 using field programmable analogue processors.

FIG. 6 illustrates how the circuit of FIG. 3 may be implemented using the TRAC field programmable analogue processor available from Fast Analog Solutions Limited. Terminals of the TRAC device are indicated by rectangles carrying numbers 1 to 22. Arrows pointing to or from the rectangles carry the numbers of interconnected terminals. The remaining numbers indicate elements which correspond to components shown in FIG. 3.

Figure 4:
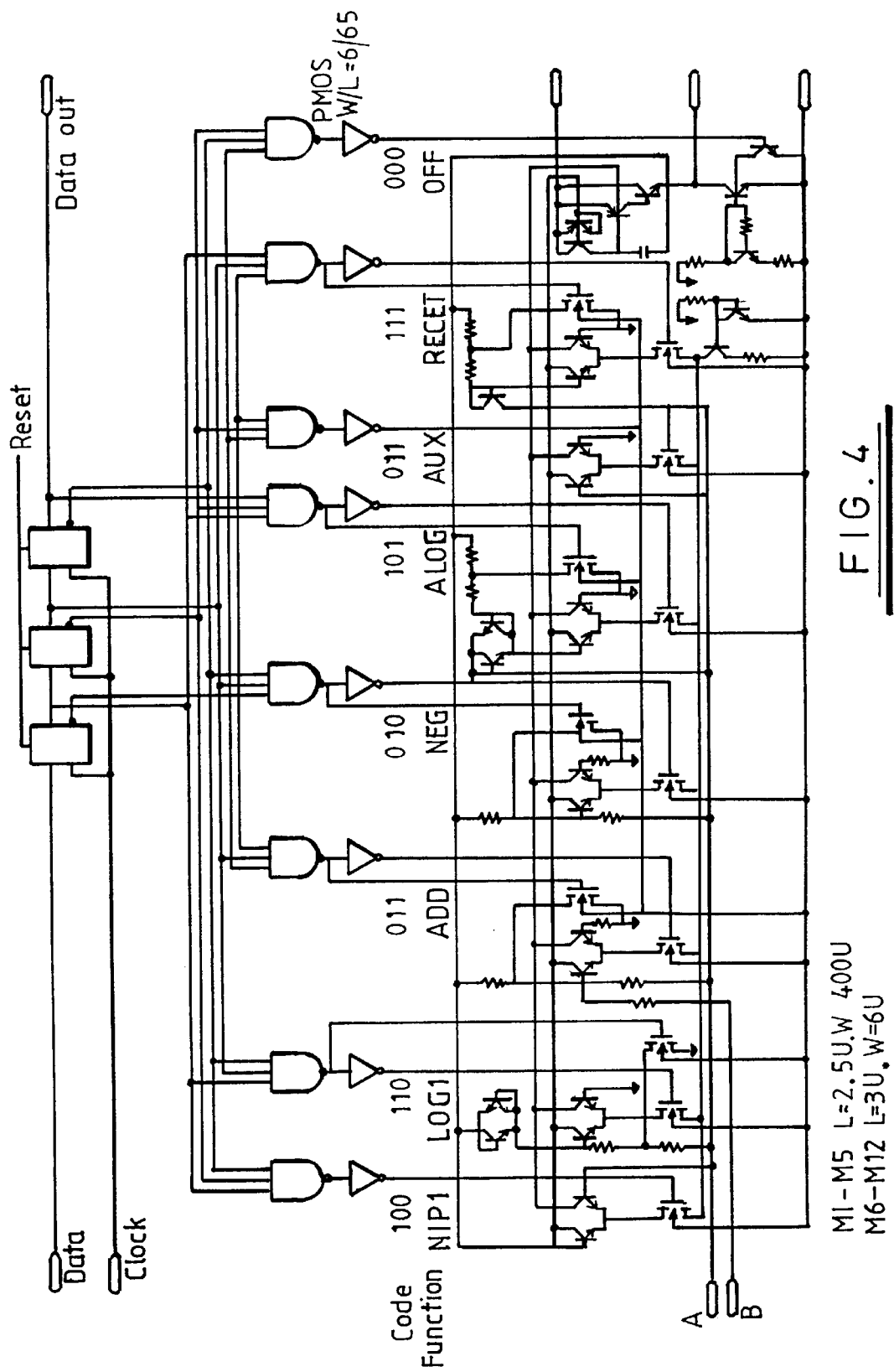
FIG. 4 illustrates circuits described in detail in International Patent Application No. PCT/GB97/02336.
Figure 7:
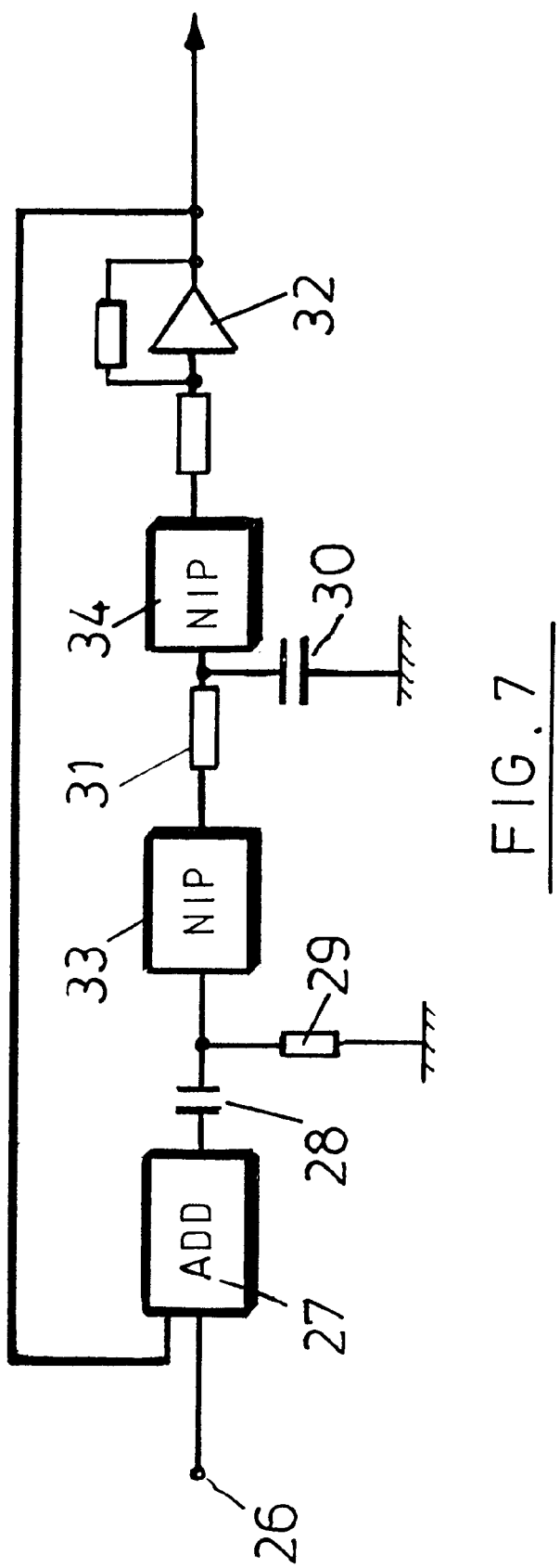
FIG. 7 illustrates a further embodiment of the invention incorporating buffers to prevent interaction between the phase advance and phase retard circuits.

FIG. 4 also shows a NIP (non-inverting pass) circuit which may be incorporated in a simplified embodiment of the invention illustrated in FIG. 7. In FIG. 7, an input signal is applied to an input 26 of an adder 27. A high pass filter formed by a capacitor 28 and resistor 29 and a low pass filter formed from capacitor 30 and resistor 31 pass the input signal to an amplifier 32 which has a gain of less than 2. NIP circuits 33 and 34 isolate the series-connected filter stages from each other. The output signal from the amplifier 32 is fed back to a second input to the adder 27. Thus in contrast to FIG. 3 which comprises in series a high pass filter, an amplifier and a low pass filter, the circuit of FIG. 7 comprises in series a high pass filter, a low pass filter and an amplifier. Both circuits are however provided with positive feedback.

Figure 8:
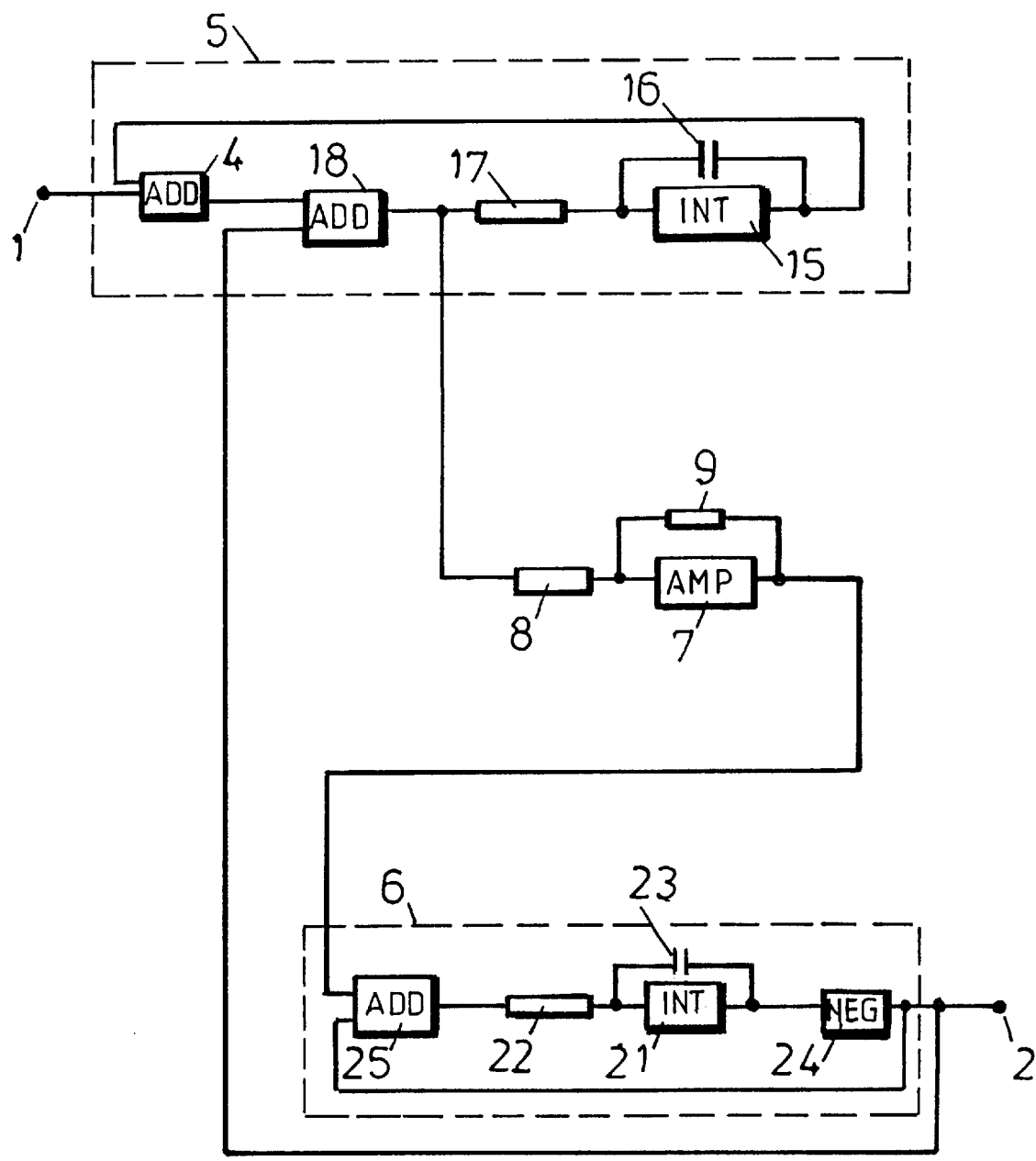
FIG. 8 shows a circuit similar to that of FIG. 3 but with a reduced number of negate circuits.
Figure 9:
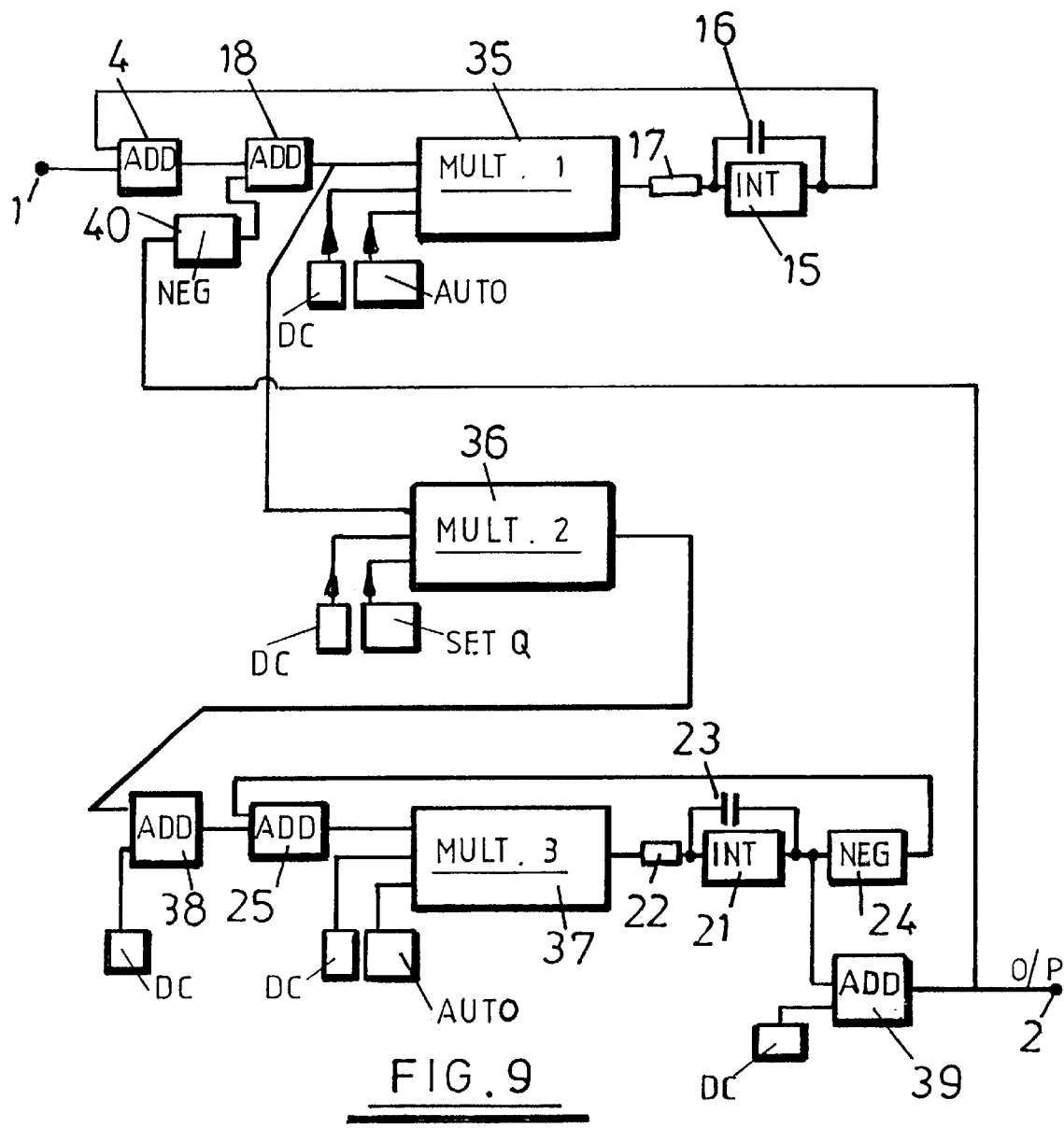
FIG. 9 illustrates a further embodiment of the present invention incorporating multipliers to compensate for variations in the values of resistive and capacitive components.

Referring now to FIG. 8, this shows a circuit similar to that of FIG. 3 but configured slightly differently so as to reduce the number of negate circuits required. Where appropriate the same reference numerals are used in FIG. 8 as are used in FIG. 3. It will be seen that in the circuit of FIG. 8 the output 2 is connected to the output of the negate circuit 24 rather than the output of the INT circuit 21. With the circuit of FIG. 8 (and with the circuit of FIG. 3) the time constants of the filters are determined by resistor/capacitor pairs. Generally these will be off-chip components as the timing components of the low pass filter must be matched to the timing components of the high-pass filter and it is very difficult indeed to achieve high accuracies in the values of on-chip capacitances and resistors. Typically, the values of resistors and capacitors provided on-chip may vary by as much as 30% as compared with the nominal value required. Accordingly if such low tolerance components were used to determine the time constants of the filters the circuit would not operate properly. It is known however that whereas the actual value of an on-chip resistor or an on-chip capacitor is difficult to predetermine, the values of such components on a single chip will be consistent. FIG. 9 illustrates a circuit which makes it possible to implement a circuit which is functionally equivalent of that of FIG. 8 using on-chip resistive and capacitive timing components.

Referring to FIG. 9, again where appropriate the same reference numerals are used as in FIG. 8. In FIG. 9 however it will be noted that a first multiplier 35 has been introduced between the adder 18 and the resistor 17, a second multiplier 36 has replaced the amplifier 7, and a third multiplier 37 has been introduced between the adder 25 and the resistor 22. The multipliers 35 and 37 are used to modify the effective values of the resistors 17 and 22 respectively to enable compensation for variations in the values of resistive and capacitive components of the phase advance and phase retard circuits. Further adders 38 and 39 have been introduced to enable bias voltages to be introduced, an additional negate circuit 40 has been introduced to reverse the inversion introduced by adder 39, and each of the multipliers is provided with two inputs, one corresponding to a DC level, the other corresponding in the case of multipliers 35 and 37 to an auto-calibration input and in the case of multiplier 36 to a Q setting input.

Figure 10:
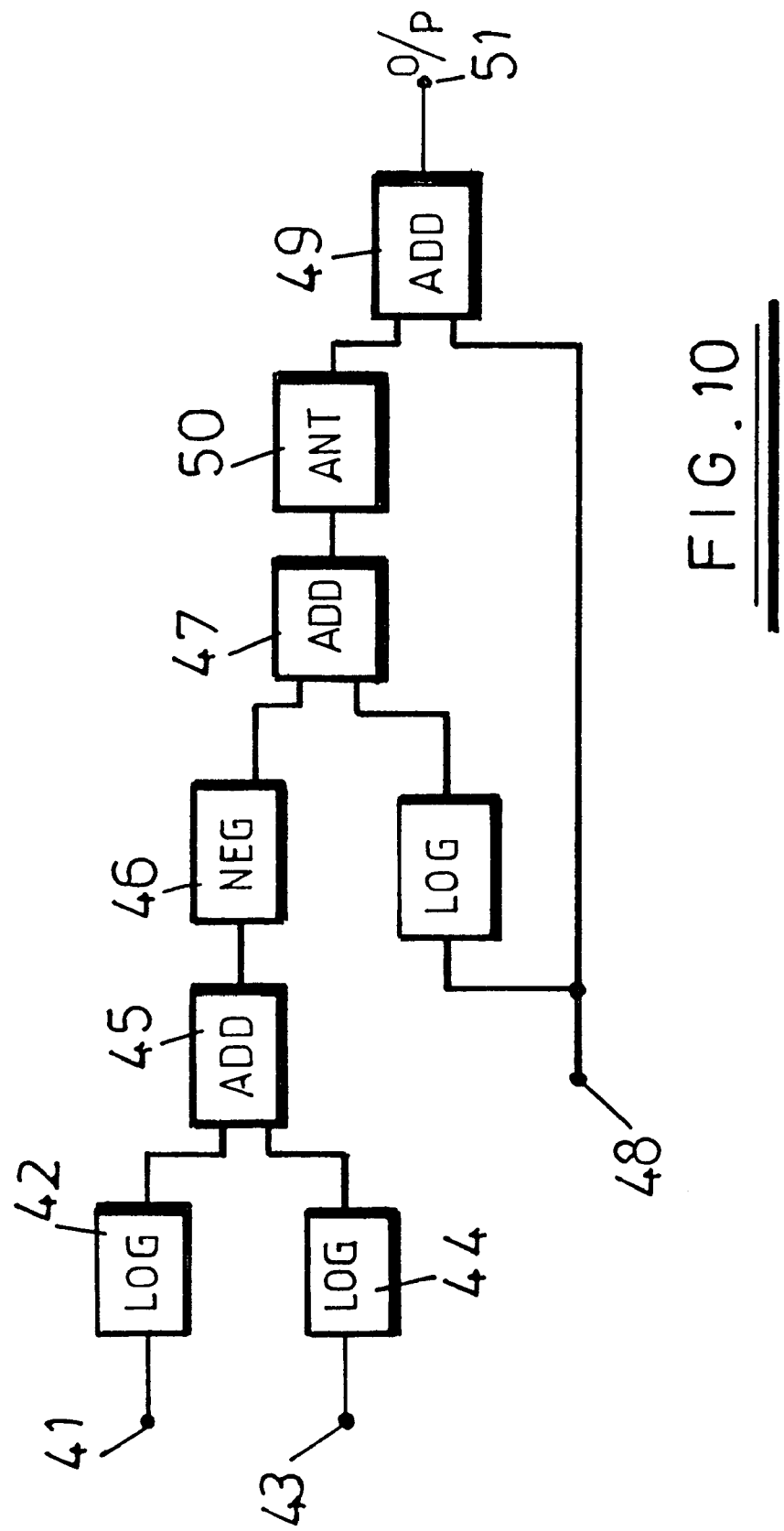
FIG. 10 illustrates circuit components which can be used to implement the circuit of FIG. 9.

FIG. 10 illustrates circuit components of the type shown in FIG. 4 which can be used to implement any of the three multipliers 35, 36 or 37. A first input 41 (corresponding for example to the output of the adder 18) is applied to a LOG circuit 42. A second input 43 (corresponding to for example the DC level applied to multiplier 35) is applied to a LOG circuit 44. The outputs of the LOG circuits are summed by an adder 45, inverted by a negate circuit 46, and applied to an input of adder circuit 47. A third input 48 (corresponding to for example the autocalibrate input applied to the multiplier 35 of FIG. 9) is applied via a further LOG circuit to adder 47 and to a further adder 49. The output of the adder 47 is applied via an anti-LOG circuit 50 to the adder 49. The output 51 of the adder 49 corresponds to the signal applied to input 41 divided by the signal applied to input 43 and multiplied by the signal applied to input 48. In the case of multipliers 35 and 37 of FIG. 9, the DC level would be applied to input 43 and the autocalibrate signal to the input 48. In the case of multiplier 36, the DC level would be applied to input 43 and the Q set signal would be applied to input 48.

Figure 11:
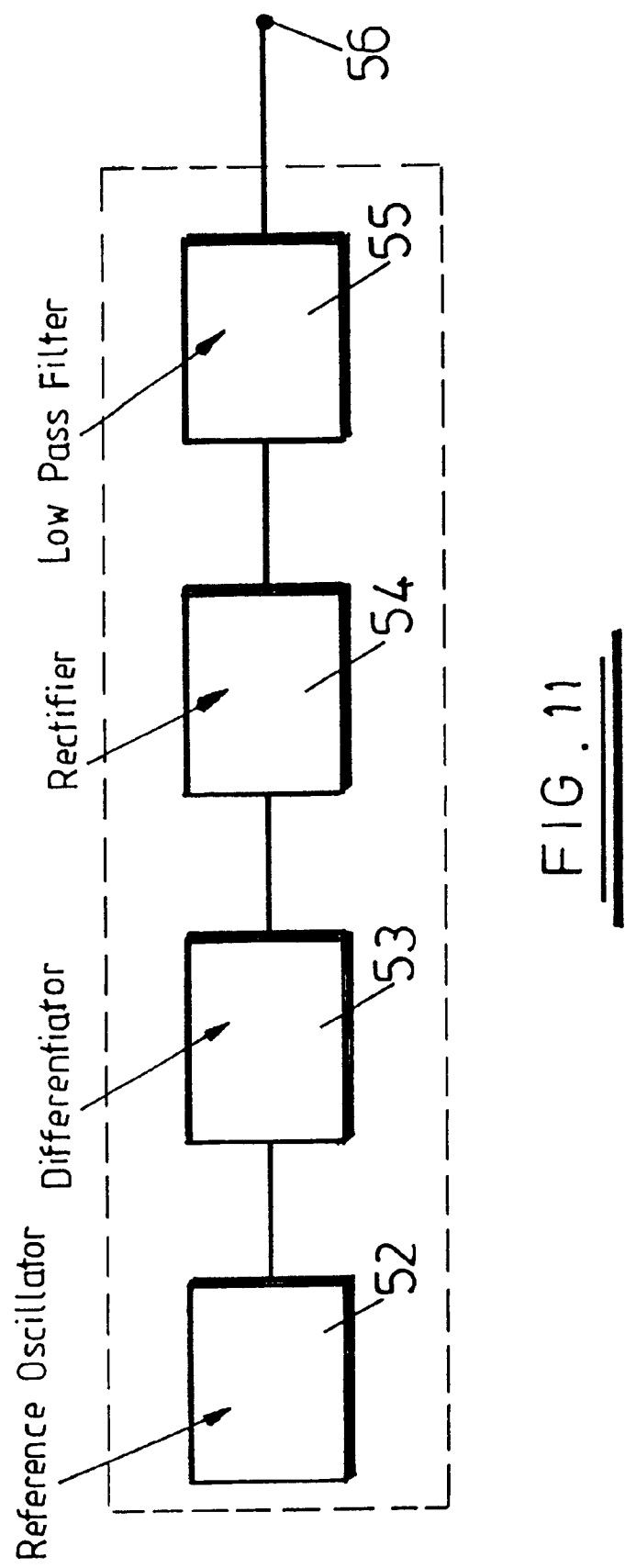
FIG. 11 illustrates a circuit for generating an auto-calibrate signal for application to multipliers shown in FIG. 9.

Referring to FIG. 11, this illustrates a circuit for generating an autocalibrate signal for application to the input 48 of multiplier 35 or 37 in FIG. 9. The autocalibrate signal generating circuit comprises a reference oscillator 52, a differentiator 53, a rectifier 54 and a low pass filter 55. The required autocalibration signal appears at output 56.

The reference oscillator 52 provides a square wave signal which is derived from a stable off-chip source. The performance of the oscillator source dictates the accuracy of the time constants of the filter circuits of FIG. 9. It will be appreciated that it is a relatively simple matter to provide a stable oscillator source as compared with providing accurate and stable resistor/capacitor components as on-chip elements.

The differentiator 53 incorporates a resistor/capacitor network with the individual resistors and capacitors incorporated on a field programmable analogue device in which all the components are mounted on a single chip. Accordingly the individual resistors and capacitors will be of relatively low value in terms of resistance and capacitance.

The rectifier 54 is also provided on the same chip as the differentiator 53 and operates to half wave rectify the output of the differentiator. This rectified output is then smoothed by the low pass filter 55.

Thus the output 56 is a DC voltage which is directly proportional to the on-chip time constants determined by the values of the resistor/capacitor components of the differentiator.

The high pass and low pass filters of the circuit of FIG. 9 incorporate resistor/capacitor (R/C) components. Those R/C components are provided on-chip so as to be substantially the same as the R/C components of the differentiator 53 in the calibration circuit. Given that the R/C components of the filters and differentiator are the same, the multipliers 35 and 37 can be arranged to operate so as to compensate for fluctuations in the values of the R/C components of the filters in response to the substantially identical variations in the R/C components of the differentiator.

Figure 12:
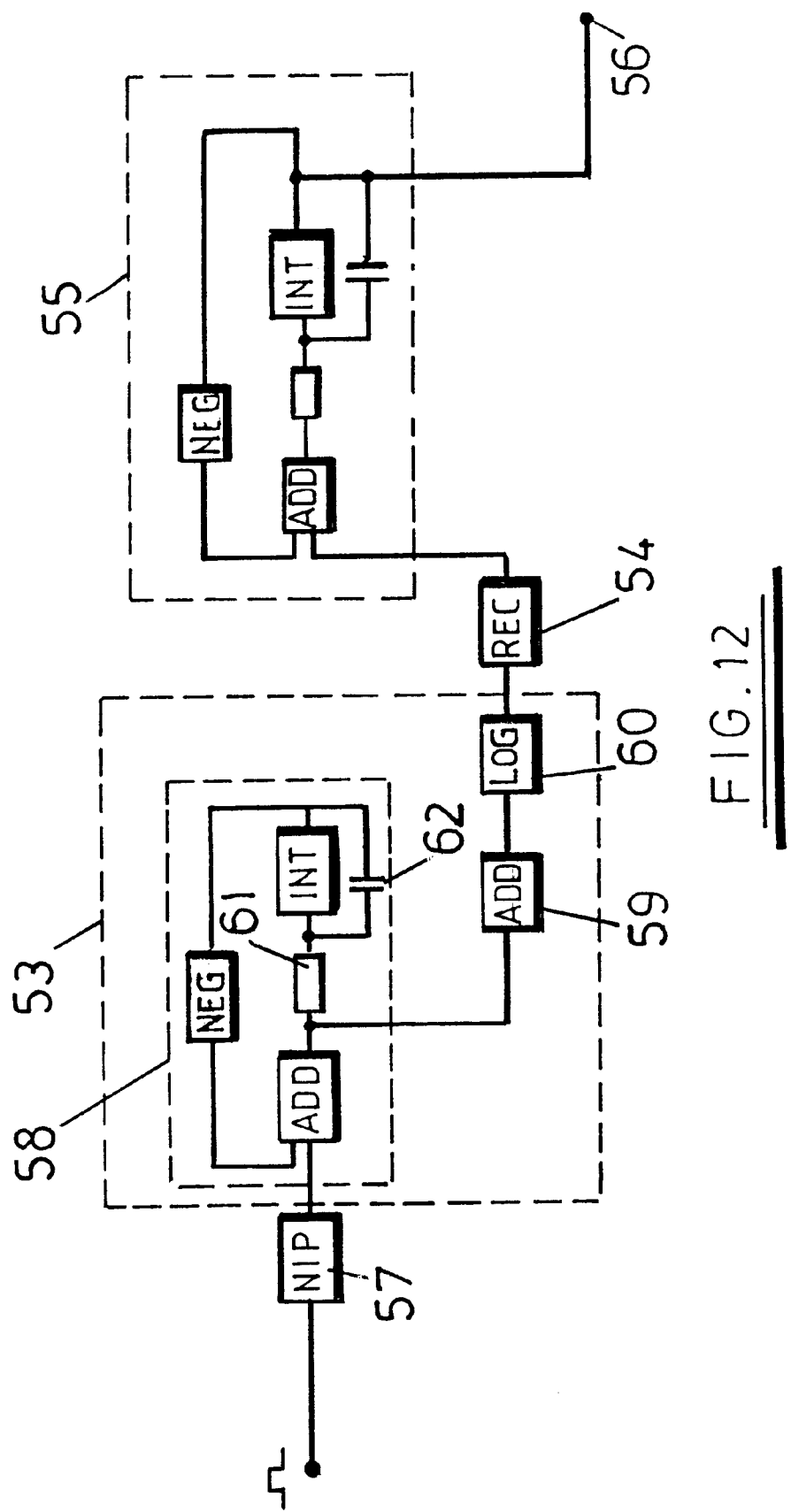

FIGS. 12 and 13 illustrate a first TRAC chip which functions as the calibration circuit of FIG. 11. FIG. 12 represents the components shown in FIG. 13 in a manner analogous to the illustration of FIG. 11, that is a non-inverting pass circuit 57 which acts as a buffer between the output of the reference oscillator 52 shown in FIG. 11 and the differentiator 53. The differentiator 53 comprises a high pass filter 58, an ADD circuit 59 and a LOG circuit 60. The high pass filter 58 comprises an on-chip resistor 61 and an on-chip capacitor 62. It is these on-chip resistor and capacitor components which can be fabricated to be consistent on a single chip despite the fact that the resistive and capacitance values of the components cannot be readily predetermined. The described arrangement is set up however such that fluctuations in these values which affect the signal output do not affect overall system performance.

In FIGS. 13 to 16, individual terminals are identified by boxes labelled with numbers from 1 to 88. Where the identified terminals are connected to other terminals this is indicated by the interconnected terminal number and by an arrow indicating the direction in which signals are transmitted between the interconnected terminals.

Referring to FIG. 14, this figure illustrates the TRAC circuit corresponding to the adder 18, multiplier 35 and integrator 15, 16, 17 of FIG. 9. The resistor 17 and capacitor 16 are on-chip. These components are identical to the components 61 and 62 of FIG. 12. Thus the resistance and capacitance values of the components 17 and 16 should vary in exactly the same manner as the components 61 and 62.

Figures 15, 16:
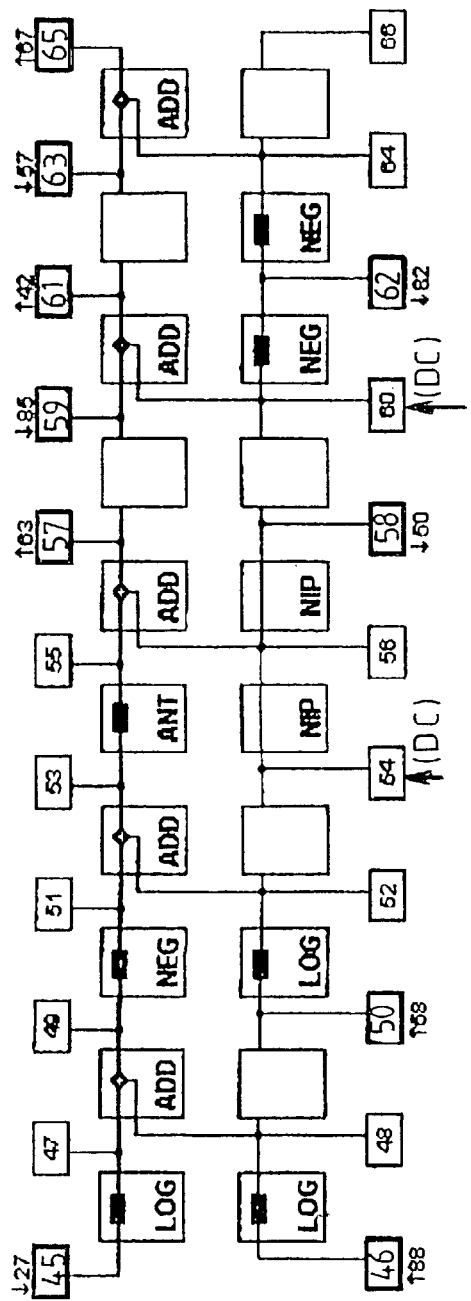

Referring to FIG. 15, this illustrates components making up the multiplier 36 of FIG. 9. The set Q input shown as being applied to multiplier 36 in FIG. 9 is the DC value applied to terminal 54 in FIG. 15.

Figure 1:
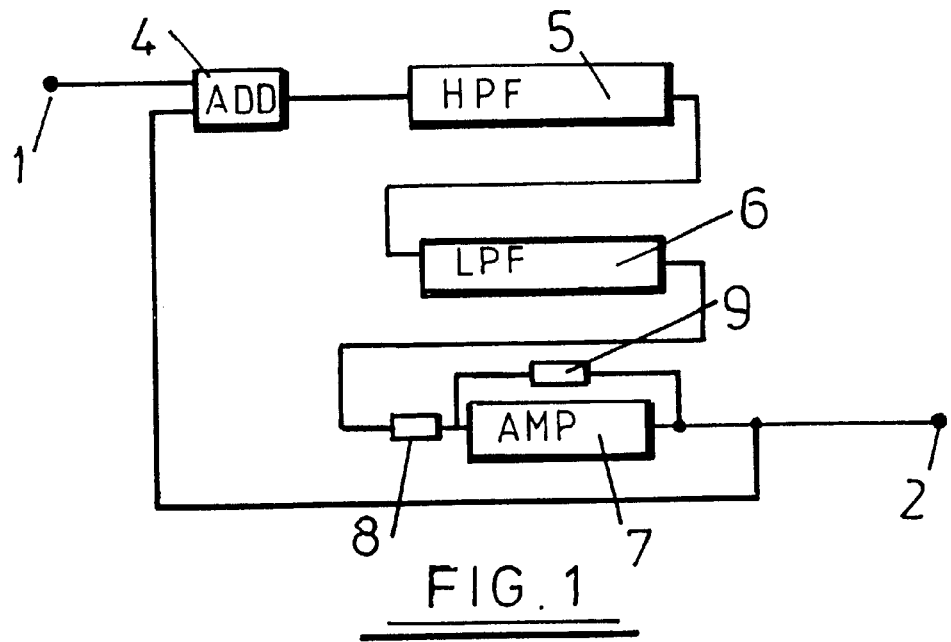
FIG. 1 illustrates a circuit which may act as a band pass filter or as an oscillator.

Referring now to FIG. 16, this illustrates circuits included in the low pass filter as shown in FIG. 9. The integrator comprises on-chip capacitor 23 (between terminals 83 and 85) and on-chip resistor 22 (between terminals 81 and 83), those components being identical to the resistor and capacitor components incorporated in the low pass filter of the autocalibration circuit (FIG. 1) and the integrator of the high pass filter.

The mean output from the reference oscillator 52 (FIG. 11) is a DC voltage given by:

$$Edc = EofCr$$

where
Eo is the amplitude of the oscillator output
f is the frequency of the oscillator output
C is the capacitance of the capacitor 62 (between pins 7 and 9 of FIG. 13)
R is the resistance of the resistor 61 (between pins 5 and 7).

The integrators 15, 16, 17 and 21, 22, 23 of the high pass and low pass filters generate outputs which are proportional to:

$$1(1-jwCR/A)$$

where
A is the multiplication factor of the preceding multiplier (35 or 37)
C is the capacitance of the integrated on-chip capacitor (between pins 41 and 43 of FIG. 14 or pins 83 and 85 of FIG. 16).
R is the resistance of the integrated on-chip resistor (between pins 39 or 41 of FIG. 14 or between pins 81 and 83 of FIG. 16).

The multiplication factor A is equal to the calibration voltage Edc such that, providing all values of C and all values of R are equal, the filter performance is independent of both C and R. Thus equal variations in all the on-chip resistive and capacitive components do not affect filter performance.

The multipliers also enable voltage tuning of the filter's basic centre frequency and also may be used to increase the magnitude of the on-chip time constant. If for example the largest practical on-chip R and C values were 100 k ohm and 100 pFs respectively then with a multiplication factor of unity the lowest filter frequency would be 16 kHz. This relatively high value can be adjusted as desired by adjusting the multiplication factor. For example, with a multiplication factor of 0.01 the lowest filter frequency would be 160 Hz.

In the calibration circuit as described in FIGS. 11 and 12, the resistor/capacitor networks forming part of the differentiator 53 and low pass filter 55 are identical to those used in the filter integrators and incorporate INT circuits. Simpler arrangements could be used however without departing from the present invention, for example by using simple CR networks alone for the differentiator and low pass filter in a manner similar to the circuit of FIG. 7. The CR values of the low pass filter are not critical to filter performance however and the low pass filter could be implemented using an off-chip capacitor.

What is claimed is:

1. A circuit comprising a phase advance circuit acting as a high pass filter, a phase retard circuit acting as a low pass filter, and an amplifier connected in series between an input and an output, a positive feedback path provided between the input and the output such that signals at the output are fed back to the input, wherein the phase advance and phase retard circuits have electrical characteristics such that interaction between the phase advance and phase retard circuits is substantially prevented.

2. A circuit according to claim 1, wherein the phase advance and phase retard circuits each comprise an output buffer.

3. A circuit according to claim 2, wherein the phase advance circuit comprises a series capacitor and a shunt resistor, and the phase retard circuit comprises a series resistor and a shunt capacitor.

4. A circuit according to claim 1, wherein the phase advance and phase retard circuits each comprise an internal closed loop negative feedback configuration providing low output impedances.

5. A circuit according to claim 4, wherein the phase advance and phase retard circuits each comprise an integrator circuit.

6. A circuit according to claim 1, wherein the amplifier comprises a multiplier responsive to a Q setting input.

7. A circuit according to claim 1, wherein the phase advance and phase retard circuits each comprising resistive and capacitive components and a multiplier configured to compensate for variations in the electrical characteristics of the resistive and capacitive components.

8. A circuit according to claim 7, further comprising a calibration circuit comprising resistive and capacitive components and providing a calibration output to the multipliers of the phase advance and phase retard circuits, the calibration circuit delivering calibration output which is responsive to variations in the values of the resistive and capacitive components of the calibration circuit.

9. A circuit according to claim 8, wherein the resistive and capacitive components of each of the phase advance circuit, the phase retard circuit, and the calibration circuit are substantially identical.

10. A circuit according to claim 9, wherein the resistive and capacitive components of each of the phase advance circuit, the phase retard circuit and the calibration circuit are on respective chips.

11. A circuit according to claim 8, wherein the calibration circuit comprises an oscillator, a differentiator, a rectifier and a low pass filter, the differentiator including the resistive and capacitive components of the calibration circuit.

12. A circuit according to claim 8, wherein the multipliers of the phase advance and each phase retard circuits are connected to receive a filter frequency setting input in addition to the calibration output of the calibration circuit.

* * * * *